(12) United States Patent
Meany et al.

(10) Patent No.: US 6,498,507 B1
(45) Date of Patent: Dec. 24, 2002

(54) CIRCUIT FOR TESTING AN INTEGRATED CIRCUIT

(75) Inventors: Thomas Meany, Bruff (IE); Adrian Sherry, Dublin (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/553,098

(22) Filed: Apr. 20, 2000

(51) Int. Cl.[7] ............................................... G01R 31/02
(52) U.S. Cl. ...................................... 324/763; 324/765
(58) Field of Search ................................. 324/763, 765, 324/158.1, 768, 769; 714/727, 733, 736

(56) References Cited

U.S. PATENT DOCUMENTS

| | | | | |
|---|---|---|---|---|
| 4,743,841 A | * | 5/1988 | Takeuchi | 324/763 |
| 5,469,075 A | * | 11/1995 | Oke et al. | 324/763 |
| 5,675,354 A | | 10/1997 | Katakura et al. | |
| 5,815,001 A | * | 9/1998 | Michael | 324/763 |
| 5,977,763 A | * | 11/1999 | Loughmiller et al. | 324/158.1 |
| 6,163,867 A | * | 12/2000 | Miller et al. | 324/763 |
| 6,323,668 B1 | * | 11/2001 | Hashimoto | 324/763 |

* cited by examiner

*Primary Examiner*—Michael Sherry
*Assistant Examiner*—Minh N. Tang
(74) *Attorney, Agent, or Firm*—Samuels, Gauthier & Stevens, LLP

(57) ABSTRACT

A circuit used for testing an integrated circuit including a chop circuit. A source of a test signal coupled to a first pair of pins of the integrated circuit. A test signal measuring device to measure the test signal coupled to a second pair of pins of the integrated circuit. A chop circuit controller produces a control signal and for feeding such control to the chop circuit and the test signal measuring device. In response to the control signal, the chop circuit couples the first pair of pins to the second pair of pins with a first polarity during a first period of time and couples the first pair of pins to the second pair of pins with an opposite polarity during a second period of time.

12 Claims, 15 Drawing Sheets

$V_{ADC}|_1 = V_{TEST} - (V_1 - V_2)$ $V_{DVM}|_2 = V_{TEST} + (V_1 - V_2) - (V_4 + V_3)$ $V_{DVM}|_1 - V_{DVM}|_2 = 2V_{TEST} - 2(V_1 - V_2)$ $\Delta V_{DVM} = V_{TEST} - (V_1 - V_2)$ $V_{TEST} - (V_1 - V_2) = V_{ADC}$ $V_{ADC} = V_{TEST} - (V_1 - V_2)$ $V_{DVM}|_1 = V_{TEST} - (V_1 - V_2) - (V_4 - V_3)$ $$V_{ADC} = V_{TEST} - (V_1 - V_2)$$

$$V_{DVM|2} = V_{TEST} + (V_1 - V_2) - (V_4 - V_3)$$

$$\Delta V_{DVM} = V_{DVM|1} - V_{DVM2} = 2V_{TEST} - 2(V_1 - V_2)$$

$$\Delta V_{DVM|2} = V_{TEST} - (V_1 - V_2)$$

CIRCUIT FOR TESTING AN INTEGRATED CIRCUIT

BACKGROUND OF THE INVENTION

This invention relates generally to test circuitry and more particularly to test circuitry adapted for testing integrated circuits.

As is known in the art, a simple test circuit merely includes a source of a known voltage which is fed to a circuit under test. One such an arrangement is shown in FIG. 1 where the device under test (DUT) is an analog to digital converter (ADC). In this very simple case, the test voltage is applied to the DUT and it is assumed that the voltage on the input pins is equal to the applied test voltage, to within some acceptable tolerance. Thus, since here the DUT is an analog to digital converter, with a known test voltage applied to the converter, the ADC should, if operating properly, produce a digital output corresponding to the applied test voltage. There are, however, a number of reasons why the applied test voltage does not appear at the input pins of the DUT. These include noise, magnetic or electrical coupling of other signals onto the wires joining the test voltage source to the pins of the DUT. In addition, the path from the test voltage source to the pins of the DUT will be comprised of many junctions where dissimilar metals make contact with each other. Each of these junctions will exhibit an electrical potential difference that is a repeatable function of temperature. For example, the sources include: the pins in the socket with the legs of the DUT; the gold pads onto which the socket may sit; the tracks on the test board (used to customize the test resources to the particular DUT); the plated through holes on that board; and, pogo pins used to connect the board to the tester. Each junction is, in effect, a thermocouple. As the DUT temperature is changed from room temperature, the voltage appearing at the DUT pins will change in response to these thermocouples so that the voltage at the DUT pins is no longer the applied test voltage.

More particularly, commonly used temperatures in integrated circuit testing are from $-55°$ C. to $+125°$ C. This means that while the test voltage remains at room temperature (e.g., $25°$ C.), the DUT may be at any temperature from $-55°$ C. to $+125°$ C. Thus, considering FIG. 1, the voltage $V_1$ and $V_2$ represent the potential from such thermocouple effect. Consequently, the voltage measured by the ADC will be $VADC=V_{TEST}-(V_1-V_2)$, where the applied test voltage is $V_{TEST}$ rather than such ADC producing a digital output representative of $V_{TEST}$.

One technique used to remove this source of error is shown in FIG. 2. Here, a digital voltmeter (DVM) is added to measure the voltage at the pins of the DUT. This solution is only partially effective because the DVM will also be at room temperature while the DUT may be at a much higher or lower temperature. Thus, the leads from the DVM to the DUT will suffer from the thermal EMFs (i.e., produce thermocouple effects) described above and represented in FIG. 2 as $V_3$ and $V_4$. Thus, referring to FIG. 2, the voltage, $V_{ACD}$, measured by the ADC will be $V_{ACD}=V_{TEST}-(V_1-V_2)$ but the voltage measured by the DVM will be $V_{DVM}=V_{TEST}-(V_1-V_2)-(V_4-V_3)$. Thus, there will be an error equal to $(V_4-V_3)$.

Variations on these techniques place great effort into the differential nature of the test voltage source and DVM leads in order to cancel out these thermal EMFs. Other efforts rely on using undesirable long leads made from homogeneous materials so that no junction exists in the material across which the temperature change exists.

As is also known in the art, a drift test is generally required for an ADC. The drift performance of an ADC is measured by applying a test voltage at a known temperature, e.g., $25°$ C., converting the test voltage to a corresponding digital word, and storing such word as a code, i.e., $code_{25}$. The DUT temperature is then changed and another conversion is performed and the digital word is stored as $code_T$. It is assumed that the input test voltage remains unchanged and that any change in the output code is due to the drift of the DUT. The drift component is then specified as:

$$DUT\ drift=(code_T-code_{25})*DUT\_lsb/(T-25);$$

Where:

DUT_lsb is the conversion factor for the ADC output code into volts; and

T is temperature in degrees Centigrade.

This gives a result in volts per degree C. Sometimes the drift result will be returned in PPM per degree C. which is a similar calculation. Drift is normally specified separately for positive and negative changes in temperatures around $25°$ C.

One method of applying a known voltage is to use an "internal short" test mode. This mode allowed the generation of a very stable zero volts by literally shorting the ADC inputs together internally to the DUT and connecting them to an internal pin which can be used as a common mode voltage. Thus, referring to FIG. 1, the two inputs to the ADC are shorted together.

However, measuring drift with a non-zero input then still remains a challenge. In particular, the problem of full-scale, negative full-scale, and gain drifts remain. To ensure that an external input remains stable as the DUT temperature is increased, the ADC evaluation used a dedicated printed circuit board which contained the minimum number of external components. This printed circuit board was enclosed in a sealed box whose temperature could be raised or lowered by an external temperature forcing system. On the printed circuit board sat the DUT so that as the DUT temperature was raised so was the temperature of the printed circuit board. The test voltage source is applied to the DUT through a series of long cables. One end of the cable sat at ambient temperature and the other end was at the temperature of the DUT. With shorter cables, the temperature gradient on the cable would be large and the junctions at either end could lead to fluctuating thermal EMFs.

One method used to perform a drift test is to generate the analog input with a resistor divider on the printed circuit board which sits in the temperature chamber. One end of the resistor divider goes to ground and the other to a reference potential. This makes any change in the reference potential to the DUT appear ratiometric on the analog input and removes the effect of such change in reference potential. However, this method is not entirely satisfactory because in order to generate full scale on a gain of two setting, equal valued resistors are required in order to generate half the reference potential. These resistors will have a temperature coefficient. Therefore, their resistance will change with temperature.

SUMMARY OF THE INVENTION

In accordance with the present invention a circuit is provided for testing an integrated circuit. The circuit includes: a chop circuit; a source of a test signal coupled to a first pin and a second pin of the integrated circuit; and a test signal measuring device to measure the test signal coupled to a third pin and a fourth pin of the integrated circuit. A chop circuit controller is provided for producing a control signal, for example a bi-level signal, and for feeding such control signal to the chop circuit and the test signal measuring device. During one period of time, in response to the control signal, the chop circuit couples the first pin to the third pin and the second pin to the fourth pin. During another period of time, in response to the control signal, the chop circuit couples the first pin to the fourth pin and the second pin to the third pin. A difference between a measurement made by the measuring device during the first-mentioned period of time and a measurement made during the later-mentioned period of time is calculated and divided by two.

With such an arrangement, the test signal measuring device monitors the voltage at the pins of the integrated circuit under test (i.e., DUT) and performs calculations on such measurements which null any thermocouple produced EMF effects on leads between the test signal source and the pins of the DUT and leads between the test measuring device and pins of the DUT.

Further, with such an arrangement, no special board is required. Here, the test signal source can drift with temperature and the drift of the DUT under the test can still be accurately measured.

Typically, the chop circuit is disposed on the integrated circuit.

In accordance with another feature of the invention, circuitry is provided for testing an integrated circuit. The circuit includes a chop circuit; a source of a test signal coupled to the integrated circuit; a test signal measuring device to measure the test signal coupled to the integrated circuit; and, a chop circuit controller. The controller produces a control signal. In response to such control signal, the chop circuit couples the test signal source to the test signal measuring device with a first polarity during one period of time and couples the test signal source to the test signal measuring device with an opposite polarity during another period of time.

In accordance with another feature of the invention, a circuit is provided for testing an integrated circuit. The circuit includes: a chop circuit; a source of a test signal coupled to a first pair of pins of the integrated circuit; a test signal measuring device to measure the test signal coupled to a second pair of pins of the integrated circuit; and, a chop circuit controller for producing a control signal and for feeding such control signal to the chop circuit and the test signal measuring device. In response to such control signal, the chop circuit, during one period of time couples the first pair of pins to the second pair of pins with a first polarity and during another period of time couples the first pair of pins to the second pair of pins with an opposite polarity.

In one embodiment of the invention the integrated circuit includes an analog to digital converter and wherein the chopper circuit is coupled between the first pair and the analog to digital converter.

In another embodiment of the invention, the integrated circuit includes an analog to digital converter and wherein the chopper circuit is coupled between the first pair and the test signal measuring device.

In accordance with still another feature of the invention, a method is provided for testing an integrated circuit. The method includes: coupling a source of a test signal to a first pair of pins of the integrated circuit; coupling a test signal measuring device to measure the test signal to a second pair of pins of the integrated circuit; and coupling the first pair of pins to the second pair of pins with a first polarity during one period of time and coupling the first pair of pins to the second pair of pins with an opposite polarity during another period of time.

In one embodiment, the method includes subtracting a signal measured by the measuring device when the first pair of pins is coupled to the second pair of pins with the first polarity from a signal measured by the measuring device when the first pair is coupled to the second pair of pins with the opposite polarity.

BRIEF DESCRIPTION OF THE DRAWINGS

These and other features of the invention, as well as the invention itself will become more readily apparent from the following detailed description when read together with the accompanying drawings, in which.

DETAILED DESCRIPTION

Figure 1:
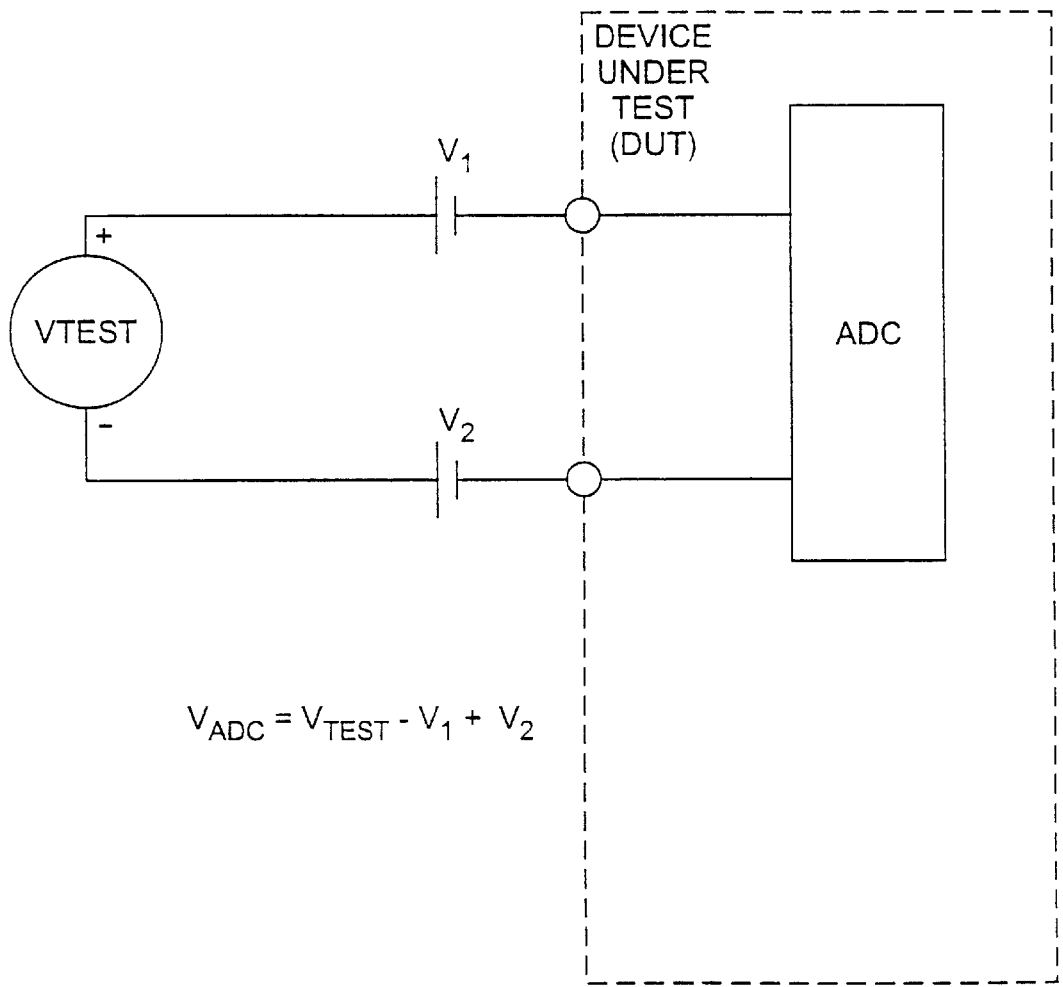
FIG. 1 is a schematic diagram of a test circuit according to the PRIOR ART.
Figure 2:
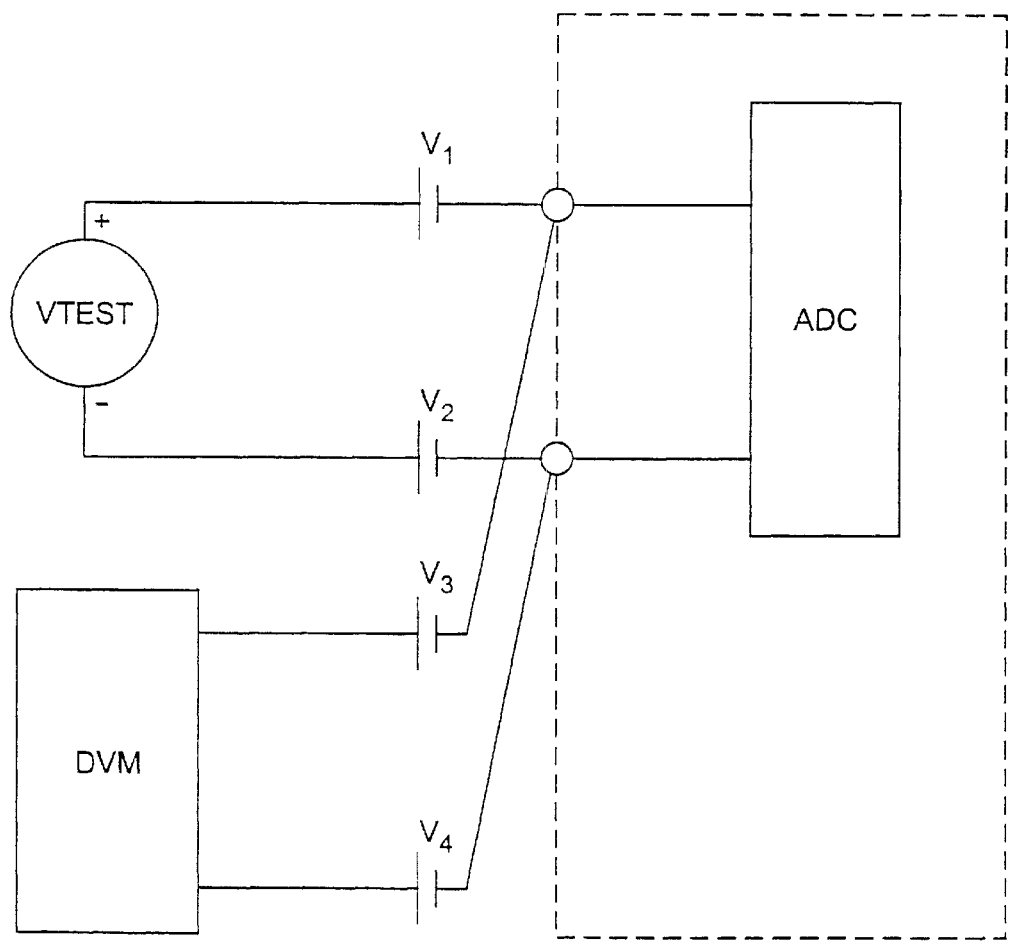
FIG. 2 is a schematic diagram of another test circuit according to the PRIOR ART.
Figure 3:
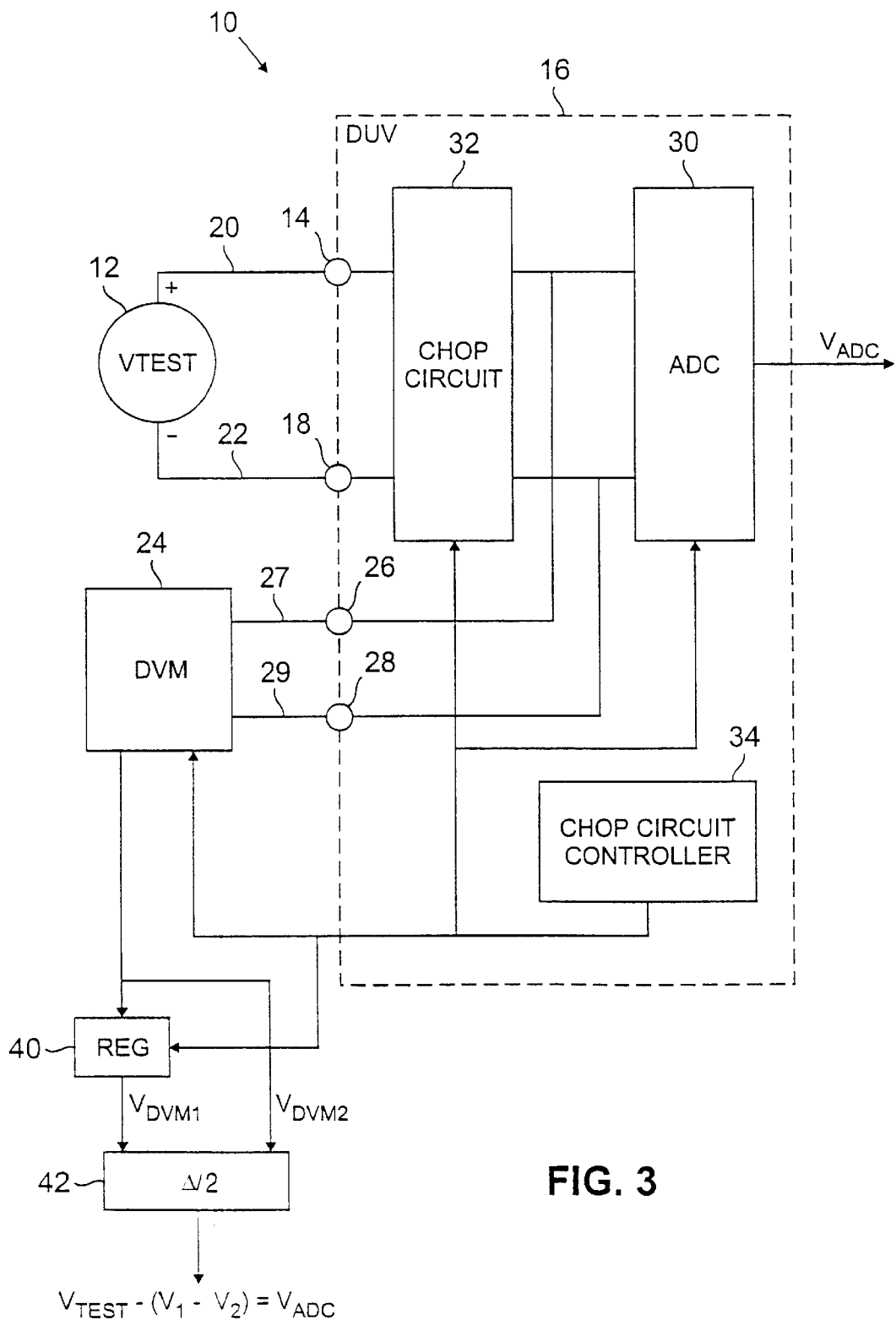
FIG. 3 is a schematic diagram of a test circuit according to the invention.

Referring now to FIG. 3, a test circuit 10 is shown to include a test signal source 12, here a voltage source adapted to produce voltage $V_{TEST}$ between the positive (+) terminal thereof and the negative (−) terminal thereof. The positive terminal + of the source 12 is connected to pin 14 of a device under test (DUT) 16 (here an analog to digital converter (ADC) which is formed as an integrated circuit chip). The − terminal of the source 12 is connected to pin 18 of the DUT 16 through lead 22. A test signal measuring device 24, here a digital voltmeter (DVM), is coupled to pins 26 and 28 of the integrated circuit DUT 16, through leads 27 and 29, respectively, as indicated.

The integrated circuit DUT 16 is here analog to digital converter (ADC) 30. Here, the ADC 30 has a chop circuit 32 included at its input for reducing offsets as described in U.S. Pat. No. 5,675,334, entitled "Analog to Digital Conversion System". The integrated circuit DUT 16 includes a chop circuit controller 34. The controller 34 produces a control signal, here a bi-level signal having a first logic state during a first period of time, then switches to a second, complementary logic state during a second, subsequent period of time, and then returns to the first logic state. The control signal produced by the controller 34 is fed to the chop circuit 32 and to the DVM 24.

Figure 3A:
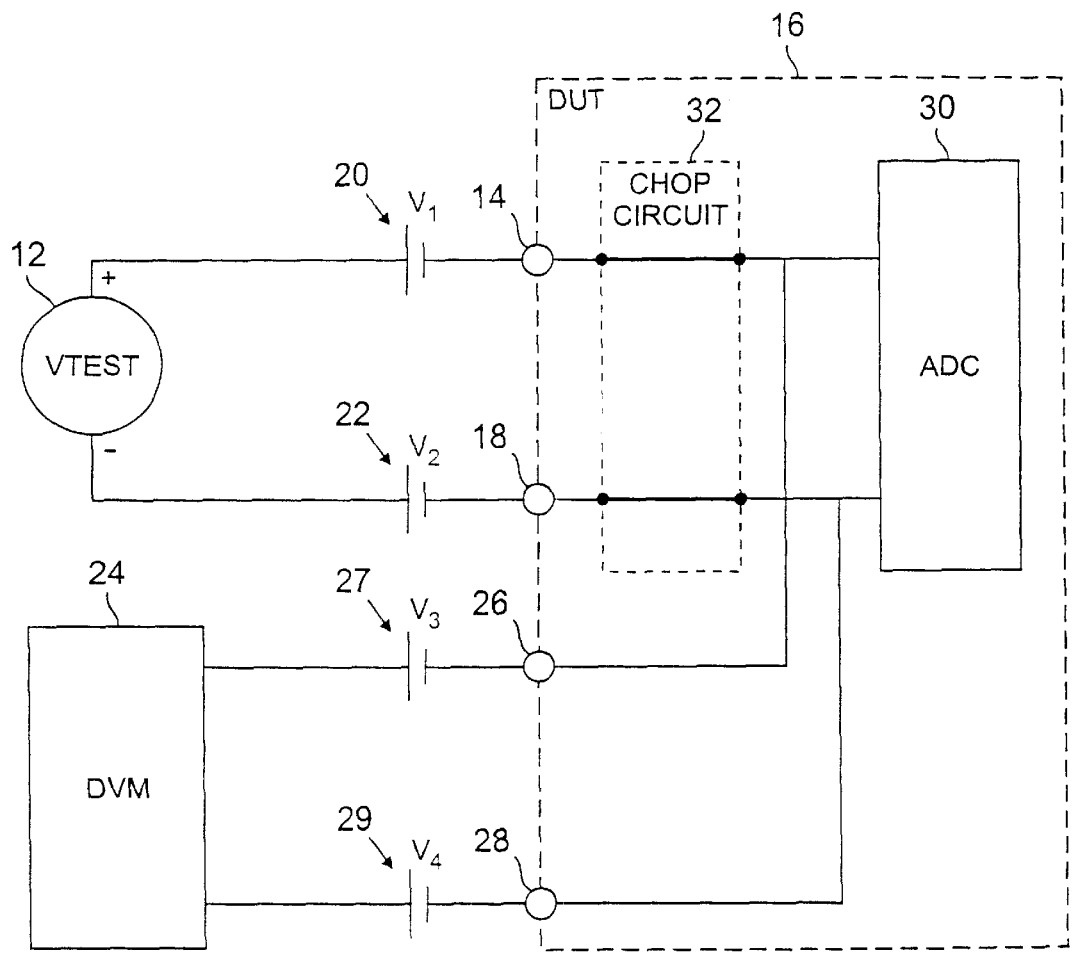
FIG. 3A is a schematic diagram of the test circuit of FIG. 3 when such circuit is configured in response to one of a control signal produced by such circuit during one period of time.
Figure 3B:
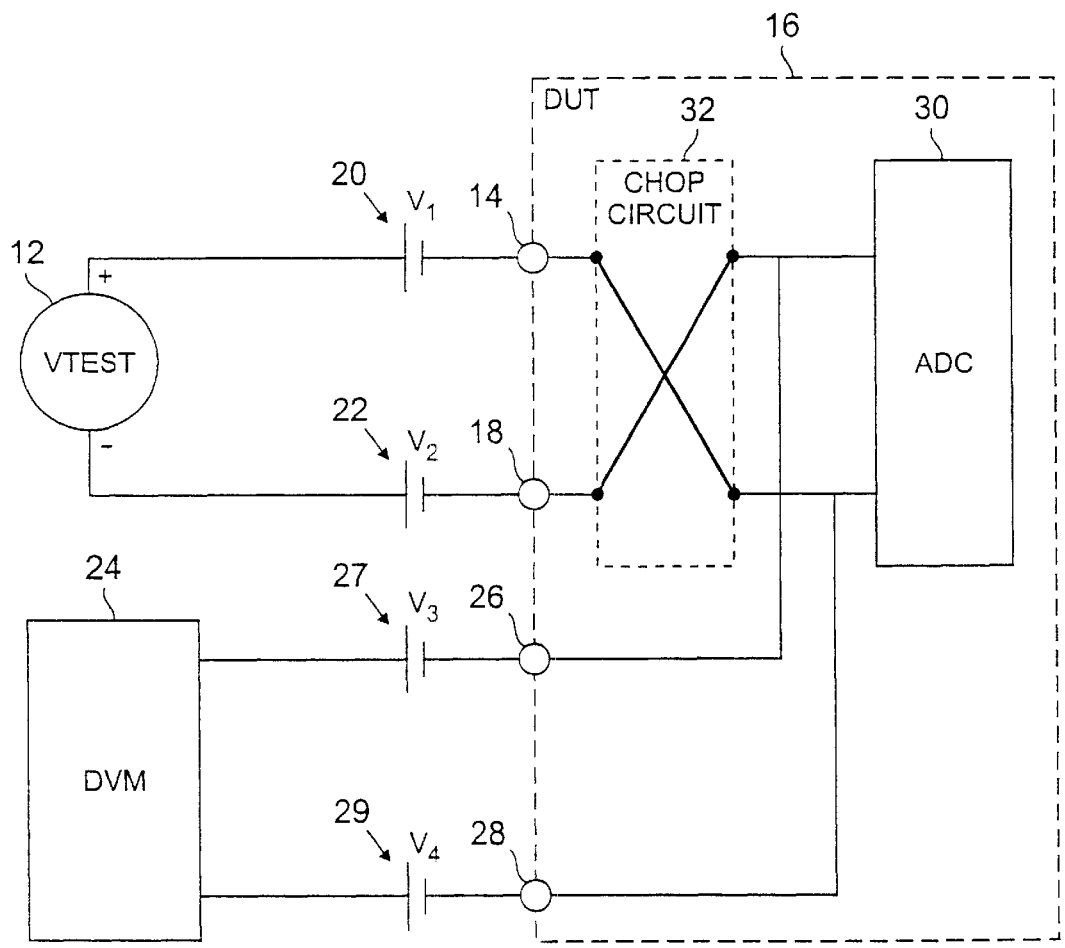
FIG. 3B is a schematic diagram of the test circuit of FIG. 3 when such circuit is configured in response to the control signal during another period of time.

Referring to FIG. 3A the configuration of the chop circuit 32 is shown in response to the control signal during the first period of time and referring to FIG. 3B the chop circuit 32 configuration is shown for the next sequential, second period of time. FIGS. 3A and 3B also show thermocouple induced EMFs. More particularly, the voltages $V_1$ and $V_2$ are offset voltages, be they thermal EMFs or otherwise between the test signal source 12 and the pins 14 and 18 of the DUT 16, respectively. The voltages $V_3$ and $V_4$ are offset voltages, be they thermal EMFs or otherwise between the DVM 24 and the pins 26 and 28 of the DUT 16, respectively. In the configuration shown in FIG. 3A, i.e., during when the chop circuit 32 in response to a control signal produced by the chop controller 34 (FIG. 3) during one period of time, the voltage measured by the ADC 30; i.e., $V_{ADC1}=V_{TEST}-(V_1-V_2)$ whereas the voltage measured by the DVM 24, i.e., $V_{DVM1}=V_{TEST}-(V_1-V_2)-(V_4-V_3)$ the configuration shown in FIG. 3B, i.e., during when the chop circuit 32 in response to the control signal during another, subsequent period of time, the voltage measured by the ADC 30; i.e., $V_{ADC2}=V_{TEST}-(V_1-V_2)$ whereas the voltage measured by the DVM 24, i.e., $V_{DVM2}=-V_{TEST}+(V_1-V_2)-(V_4-V_3)$. It is noted that the control signal is here, in this example, a bi-level signal which changes from a first logic state during a first period of time, then switches to a complementary logic state during a subsequent second period of time, and then reverts to the first logic state.

Referring to FIG. 3, the output of the DVM 24 produced when the chop circuit 32 is configured (FIG. 3A) in response to the control signal fed by the chop controller 34 during the first period of time, i.e., $V_{DVM1}=V_{TEST}-(V_1-V_2)-(V_4-V_3)$ is stored in a register 40. The output of the register 40 is fed to a "subtractor/divide-by-two" circuit 42. The output of the DVM 24 produced when the chop circuit 32 is configured (FIG. 3B) in response to the control signal fed by the chop controller 34 during the next, second, period of time, i.e., $V_{DVM2}=-V_{TEST}+(V_1-V_2)-(V_4-V_3)$ is fed to the subtractor 42. The output of the "subtractor/divide-by-two" circuit 42 is thus $V_{DVM2}-V_{DVM1}=V_{TEST}-(V_1-V_2)$ which is the same voltage measured by the ADC 30. Thus, because the voltage $V_{TEST}$ is known, the offset effect $(V_1-V_2)$ is determined (i.e., measured). It should be understood that preferably the computation described above is performed in software using a microprocessor, not shown, instead of a register and "subtractor/divide-by-two" component.

It is noted that the control signal provided by the chop circuit controller 34 to the chop circuit 32, the DVM 24 and the register 40, is also fed to the ADC 30 in order to compensate for the chopped nature of the input signal to the ADC 30. That is, after the first chop circuit time period, one of the ADC digital words in each successive pair of ADC 30 digital words is inverted with respect to the other one of the ADC digital words in such pair and the two digital words are then algebraically summed with the result being divided by two. Thus, if the ADC 30 produces successive digital words A, B, C, D, E . . . , after the first digital word, A, is produced, the outputs produced by the ADC 30 are: (A–B)/2; (C–B)/2; (C–D)/2; (E–D)/2.

It should be noted that the control signal produced by the chop control circuit 34 is fed to the register 40 to ensure that the value $V_{DVM1}=V_{TEST}-(V_1-V_2)-(V_4-V_3)$ (FIG. 3A) is stored in register 40 rather than the value $V_{DVM2}=-V_{TEST}+(V_1-V_2)-(V_4-V_3)$ (FIG. 3B) otherwise the output of the "subtractor/divide-by-two" circuit 42 would have an inverted polarity.

Figure 9:
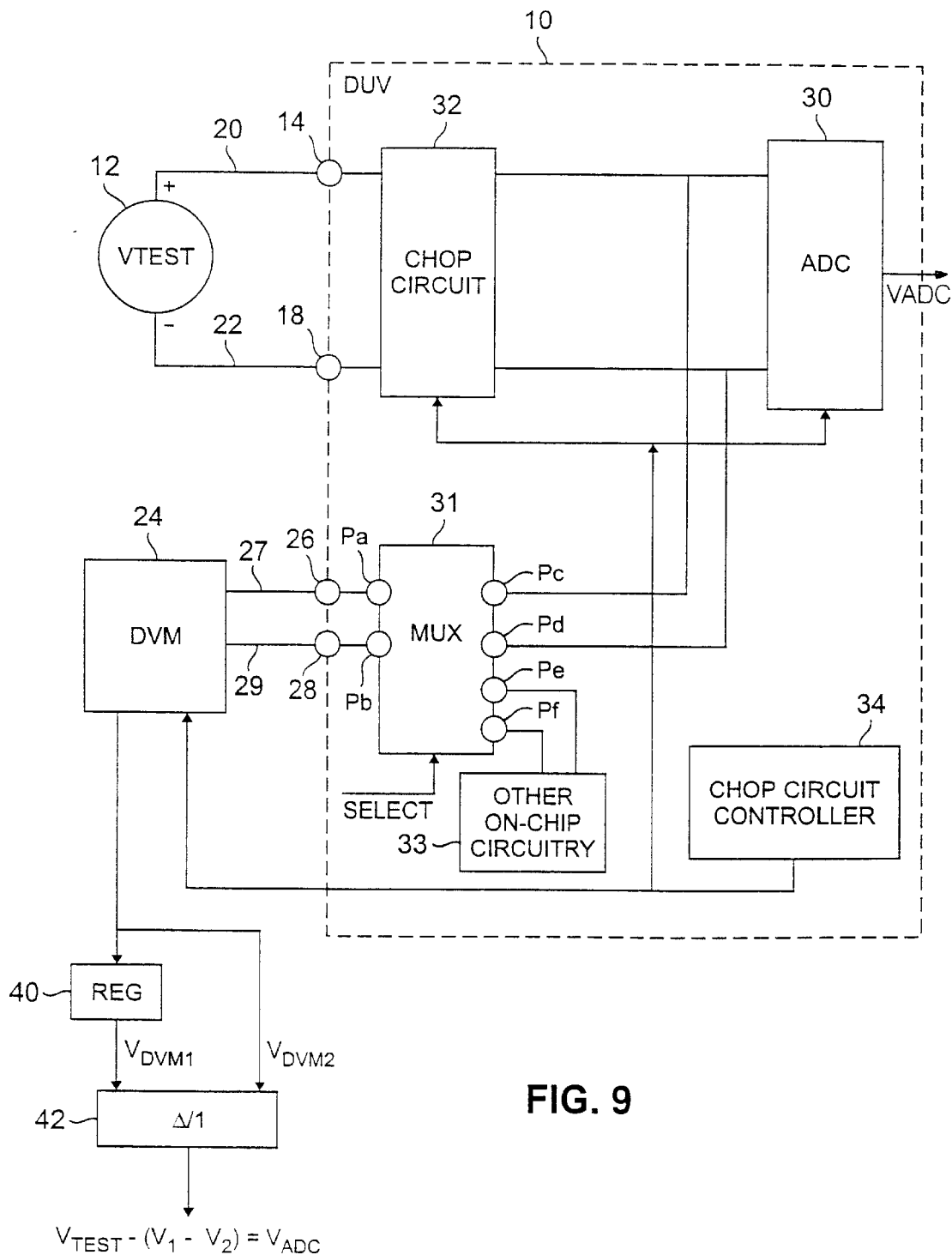
FIG. 9 is a schematic diagram of a test circuit according to yet another embodiment of the invention.

It should be noted that the pins 27, 29 might be connected to something other than the DVM 24 for non-testing applications, for example. Thus, referring to FIG. 9, the pins 26, 28 are connected to ports Pa and Pb of a multiplexer 31. The ports Pc and Pd of the multiplexer 31 are connected to the inputs of the ADC 30, as shown. An additional pair of ports Pe, Pf is coupled to other on-chip circuitry 33. The multiplexer 31 is fed with a binary SELECT signal. In response to one state of the binary SELECT signal, i.e., during a test mode, ports Pa and Pb are coupled through the multiplexer to ports Pc, Pd, respectively and thus the circuit is used as the test circuitry described above in connection with FIGS. 3, 3A and 3B. On the other hand, when the binary SELECT signal is in the opposite state, ports Pa, Pb are de-coupled from ports Pc, Pd and are instead coupled to ports Pe, Pf, respectively. Thus, during this state the other on-chip circuitry 33 is coupled to pins 26, 28b and such pins may be coupled to some other off-chip device rather than to the DVM 24.

Figure 4:
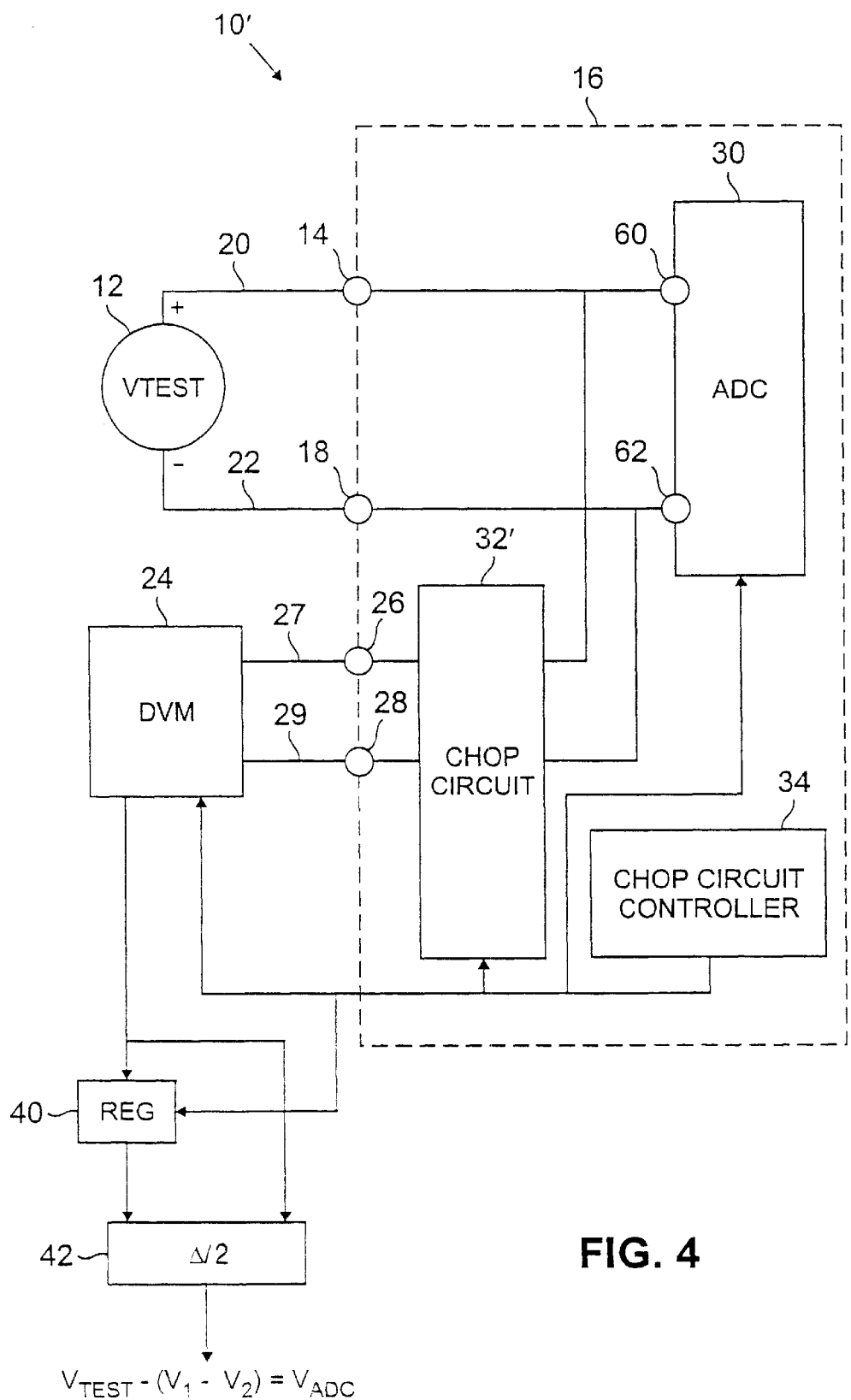
FIG. 4 is a schematic diagram of a test circuit according to another embodiment of the invention.

It is also noted that the circuit 10 described above in connection with FIGS. 3, 3A and 3B uses the chop circuit included with the ADC system. Referring now to FIG. 4, a test circuit 10 is shown. Here again, the test signal source 12, here a voltage source, is adapted to produce voltage $V_{TEST}$ between the positive (+) terminal thereof and the negative (–) terminal thereof. The positive terminal + of the source 12 is connected to pin 14 of a device under test (DUT) 16 (here, a non-chopped analog to digital converter) which is formed as an integrated circuit chip. The – terminal of the source 12 is connected to pin 18 of the DUT 16 through lead 22. A test signal measuring device 24, here a digital voltmeter (DVM), is coupled to pins 26 and 28 of the integrated circuit DUT 16, through leads 27 and 29, respectively, as indicated.

The integrated circuit DUT 16 has a chop circuit 32' coupled between pins 26, 28 and the input to the ADC 30 (and pins 14, 18, as indicated in FIG. 4).

Figure 4A:
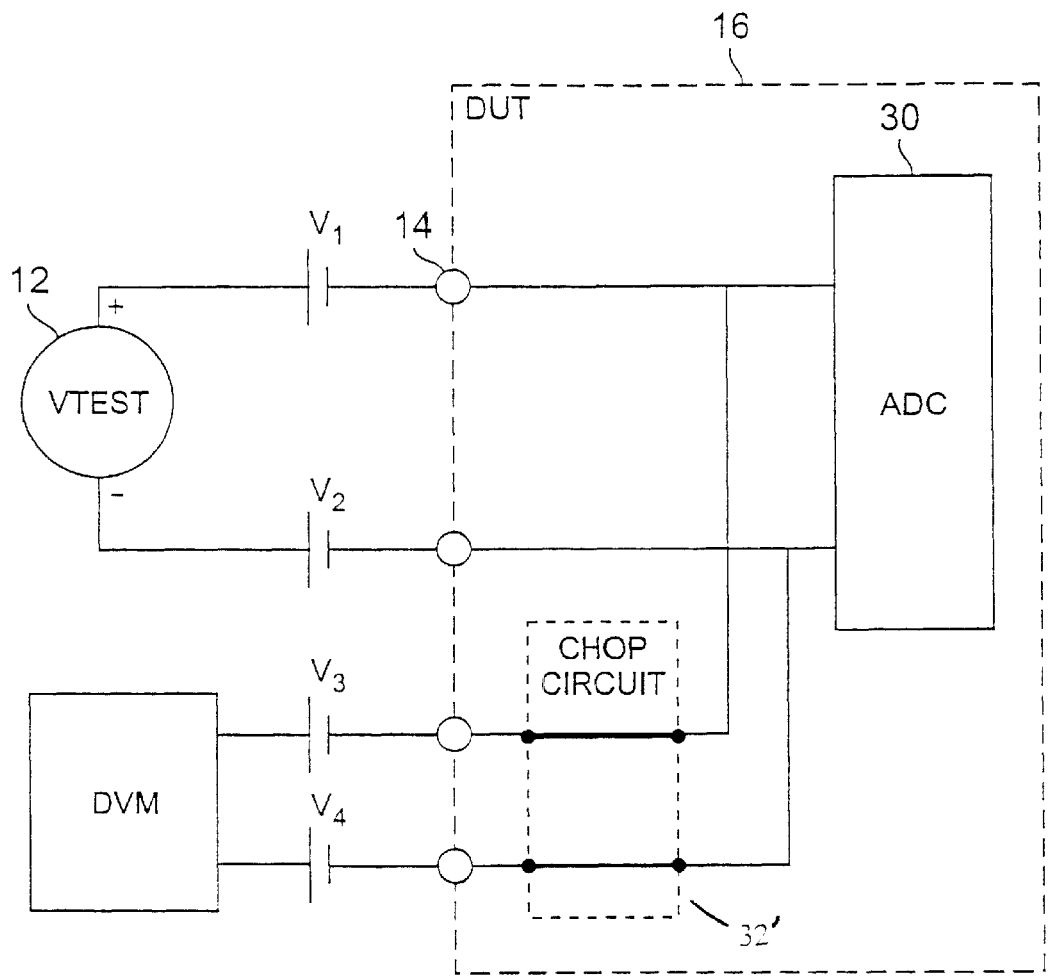
FIG. 4A is a schematic diagram of the test circuit of FIG. 4 when such circuit is configured in response to the control signal produced by such circuit during a first period of time.
Figure 4B:
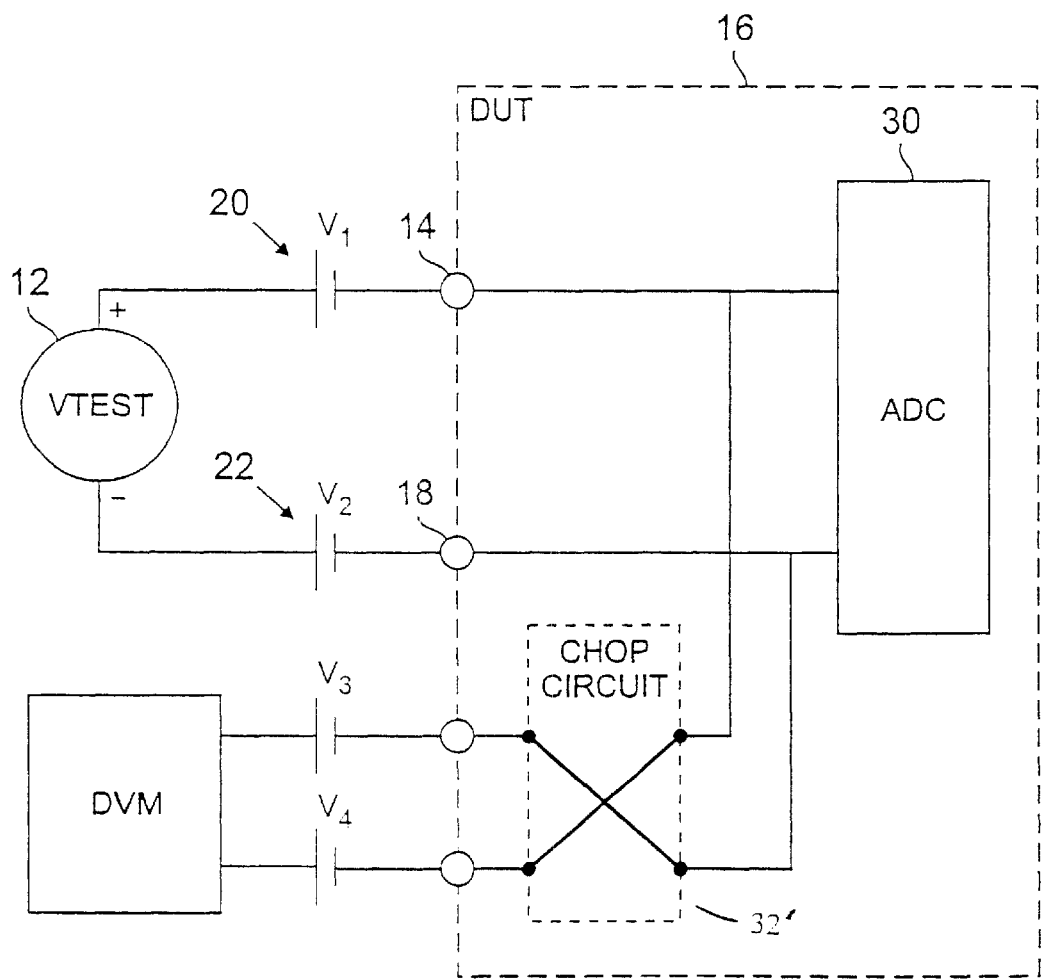
FIG. 4B is a schematic diagram of the test circuit of FIG. 4 when such circuit is configured in response to the control signal during a second period of time.

Referring to FIG. 4A the configuration of the chop circuit 32 is shown in response to the control signal produced by chop circuit 34 (FIG. 4) during the first period of time and referring to FIG. 4B the chop circuit 32' configuration is shown for the next, second period of time of the control signal (i.e., when the control signal switches to its complementary state). FIGS. 4A and 4B also show thermocouple induced EMFs. More particularly, the voltages $V_1$ and $V_2$ are offset voltages, be they thermal EMFs or otherwise between the test signal source 12 and the pins 14 and 18 of the DUT 16, respectively. The voltages 73 and 74 are offset voltages, be they thermal EMFs or otherwise between the DVM 24 and the pins 26 and 28 of the DUT 16, respectively. In the configuration shown in FIG. 4A, i.e., during when the chop circuit 32' in response to the control signal produced by the chop controller 34 (FIG. 4) during the first period of time, the voltage measured by the ADC 30; i.e., $V_{ADC1}=V_{TEST}-(V_1-V_2)$ whereas the voltage measured by the DVM 24, i.e., $V_{DVM1}=V_{TEST}-(V_1-V_2)-(V_4-V_3)$ the configuration shown in FIG. 4B, i.e., during when the chop circuit 32 in response the control signal produced by the chop controller 34 (FIG. 4) during the second, subsequent period of time, the voltage measured by the ADC 30; i.e., $V_{ADC1}=V_{TEST}-(V_1-V_2)$ whereas the voltage measured by the DVM 24, i.e., $V_{DVM2}=-V_{TEST}+(V_1-V_2)-(V_4-V_3)$.

Referring to FIG. 4, the output of the DVM 24 produced when the chop circuit 32 is configured (FIG. 4A) in response to the control signal fed by the chop controller 34, during the first period of time i.e., $V_{DVM1}=V_{TEST}-(V_1-V_2)-(V_4-V_3)$ is stored in the register 40. The output of the register 40 is fed to the "subtractoridivide-by-two" circuit 42. The output of the DVM 24 produced when the chop circuit 32 is configured (FIG. 4B) in response to the control signal fed by the chop controller 34 during the second period of time, i.e., $V_{DVM2}=-V_{TEST}+(V_1-V_2)-(V_4-V_3)$ is fed to the "subtractor/divide-by-two" circuit 42. The output of the "subtractor/divide-by-two" circuit 42 is thus $V_{DVM2}=-V_{DVM1}=V_{TEST}-(V_1-V_2)$ which is the same voltage measured by the ADC 30.

It should be noted that with circuit 10', the chop circuit is only enabled during a test mode since it is not directly in the path between the input pins 16, 18 which would be coupled to an analog signal being converted into a corresponding digital; signal. Instead, the chop circuit in test circuit 10' monitors the voltage on the input pins 16, 18 by connecting in parallel fashion across the input pins 16, 18. This allows the invention to be used with circuits which do not normally contain chop circuits, as in the circuit 10.

Figure 5:
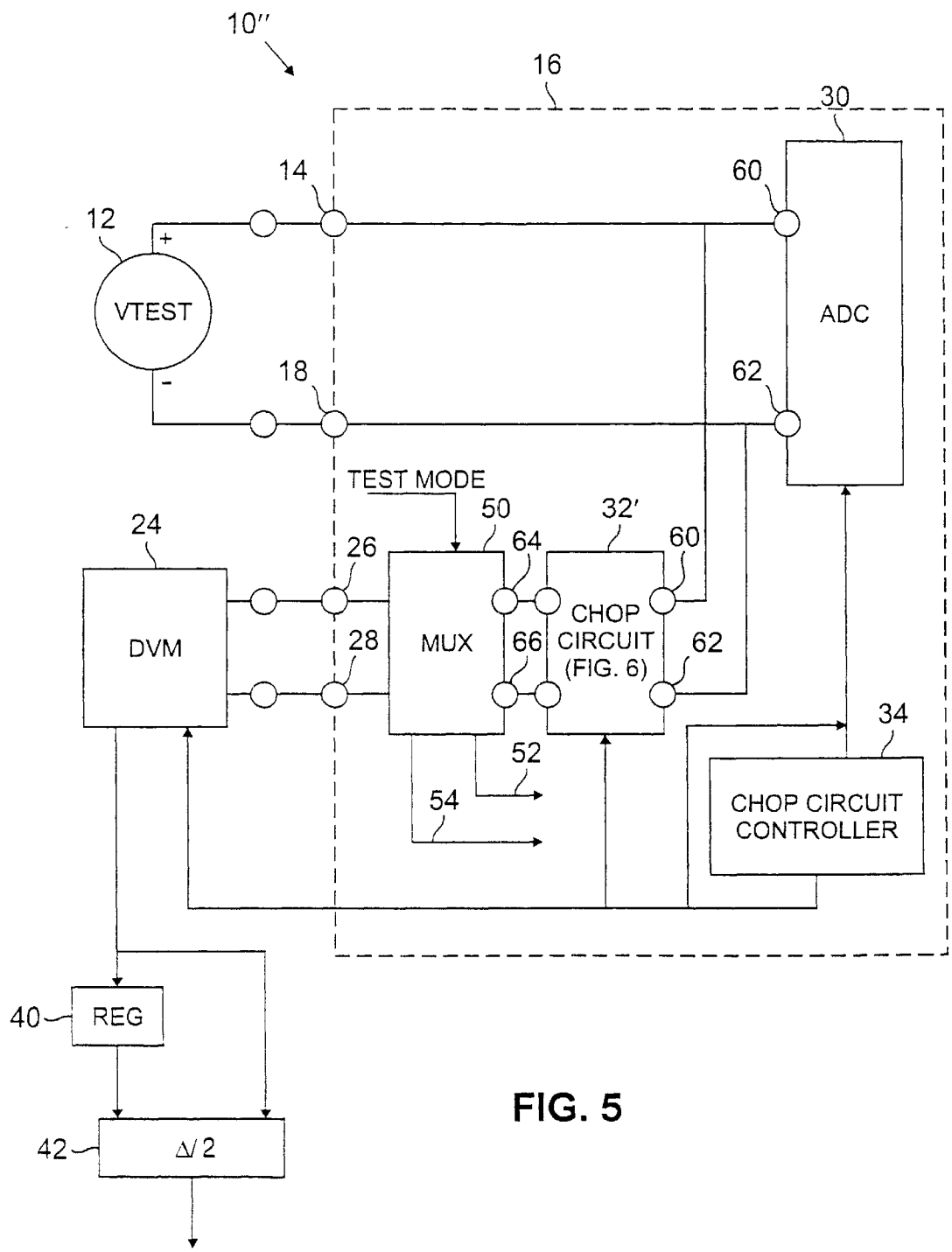
FIG. 5 is another alternative embodiment of the invention.

Referring now to FIG. 5 a test circuit 10 is shown similar to the test circuit 10 shown in FIG. 4 and with the same elements being designated with the same numerical designation. Here, circuit 10" includes a multiplexer 50 coupled to the pins 26, 28. During a test mode, the multiplexer 50 couples pins 26 and 28 to the chop circuit 32' and the test circuit operates as described above in connection with FIGS. 4, 4A and 4B. When not in the test mode, the multiplexer 50 couples pins 26, 28 to lines 52, 54 for use by the integrated circuit 16 as desired. The multiplexer 50 is switched between the test mode and the non-test mode by a signal on line TEST. It should be understood that a multiplexer such as multiplexer 50 may be used in the circuit 10 shown in FIG. 3. In such case the multiplexer is coupled between pins 16, 18 and the chop circuit.

Figure 6:
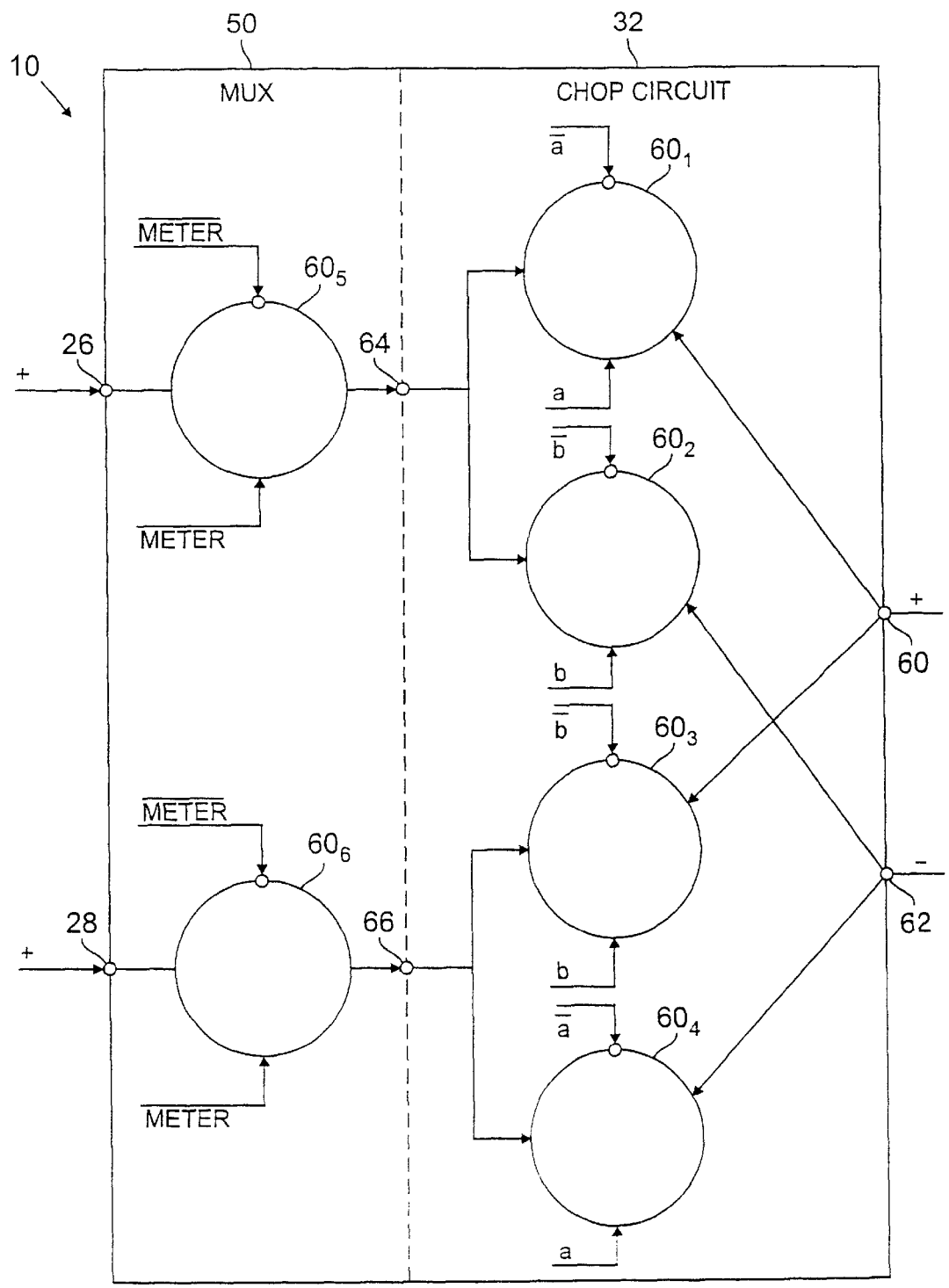
FIG. 6 is a schematic diagram of a multiplexer and chop circuit adapted for use in the test circuit of FIG. 5.

Referring now to FIG. 6, multiplexer 50 and chop circuit 32 are shown adapted for use with the test circuit 10 shown in FIG. 5. The multiplexer 50 and chop circuit 32 include six switching elements $60_1-60_6$, here transport gates. The gates $60_1-60_4$ are controlled by logic signals a, $\bar{a}$, b, $\bar{b}$. The signals fed to gates $60_5$ and $60_6$ are METER and its complement $\overline{METER}$. These signals are generated by the chop circuit controller which selects whether the POSITIVE input of the ADC or the NEGATIVE input of the ADC go to the POSITIVE lead or NEGATIVE lead of the DVM (i.e., when the chop circuit is to be configured as in FIG. 4A or configured as in FIG. 4B). More particularly, when the logic signal a is logic 1 and the logic signal b is logic 0 and when the signal METER is logic 1: pin 26 is connected to port 60 of the ADC 30 through conducting transmission gates $60_5$ and $60_1$; and, pin 28 is connected to port 62 of the ADC 30 through conducting transmission gates $60_4$ and $60_6$. On the other hand, when the logic signal a is logic 0 and the logic signal b is logic 1 and when the signal METER is logic 1: pin 26 is connected to port 62 of the ADC 30 through conducting transmission gates $60_5$ and $60_2$; and, pin 28 is connected to port 60 of the ADC 30 through conducting transmission gates $60_3$ and $60_6$. It is noted that when the logic signal METER is logic 0, the chop circuit 32 (FIG. 5) is de-coupled from the DVM 34. Such may be used in circuit 10" when the multiplexer MUX is not in the test mode. In addition, a trigger signal needs to be made to run synchronously. This trigger signal could be just the signal shown in FIG. 6 or any combination of signals a, b, METER or their complements.

Figure 7:
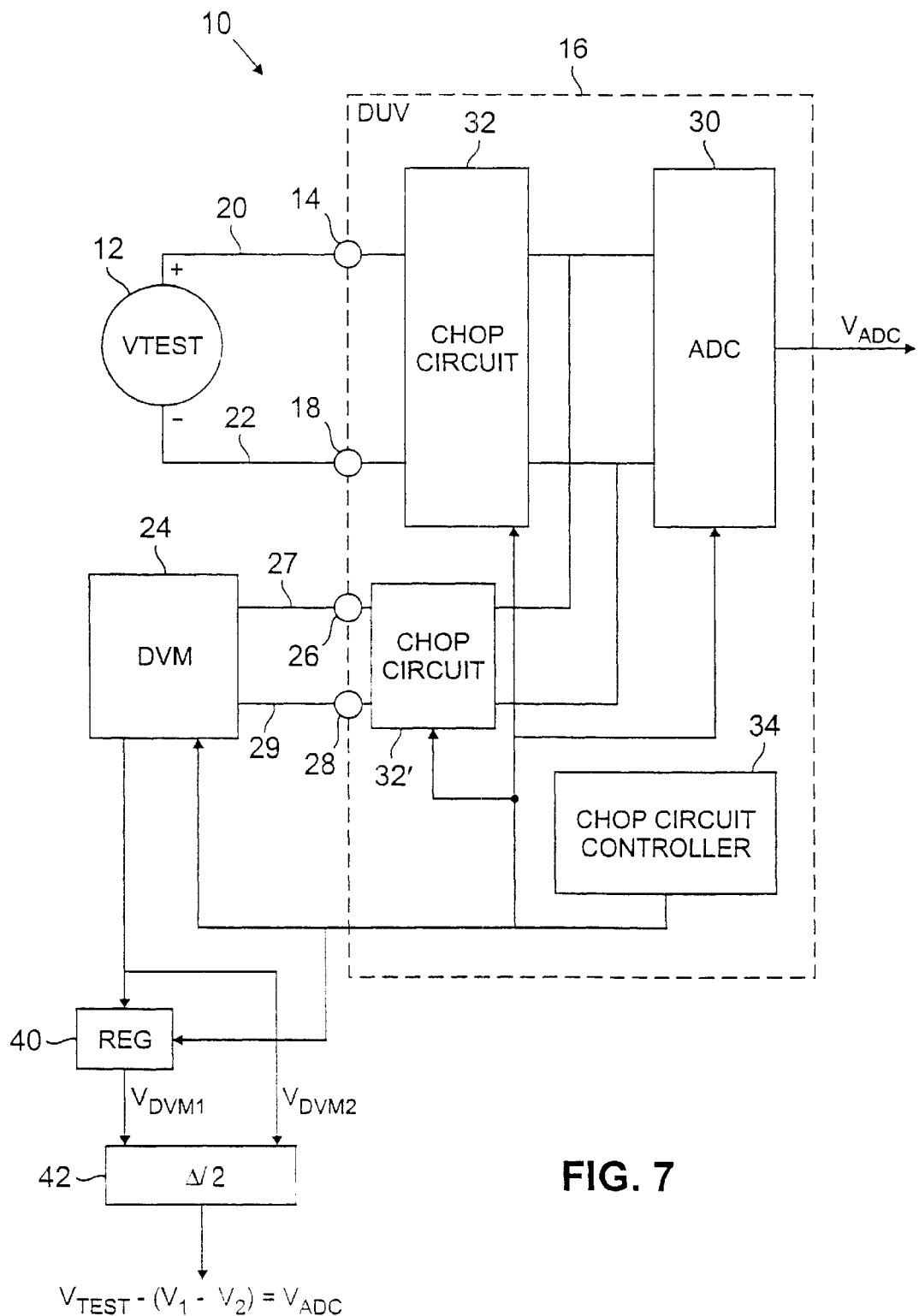
FIG. 7 is still another alternative embodiment of the invention.

Referring now to FIG. 7, an alternative embodiment is shown of the test circuit 10. here the circuit described above in connection with FIG. 3 has an additional chop circuit 32' of the type described above in FIG. 4 are on the same integrated circuit chip 16. The chop circuit 32 in FIG. 7 may be considered an "input chop circuit" and the chop circuit 32' in FIG. 7 may be considered an "output" chop circuit". Thus, by enabling only the input chop circuit 32 the test circuit is configured as in FIG. 3 and by enabling only the output chop circuit 32' the test circuit is configured as in FIG. 4. It should also be noted that both chop circuits 32, 32' may be operated simultaneously.

Figure 8:
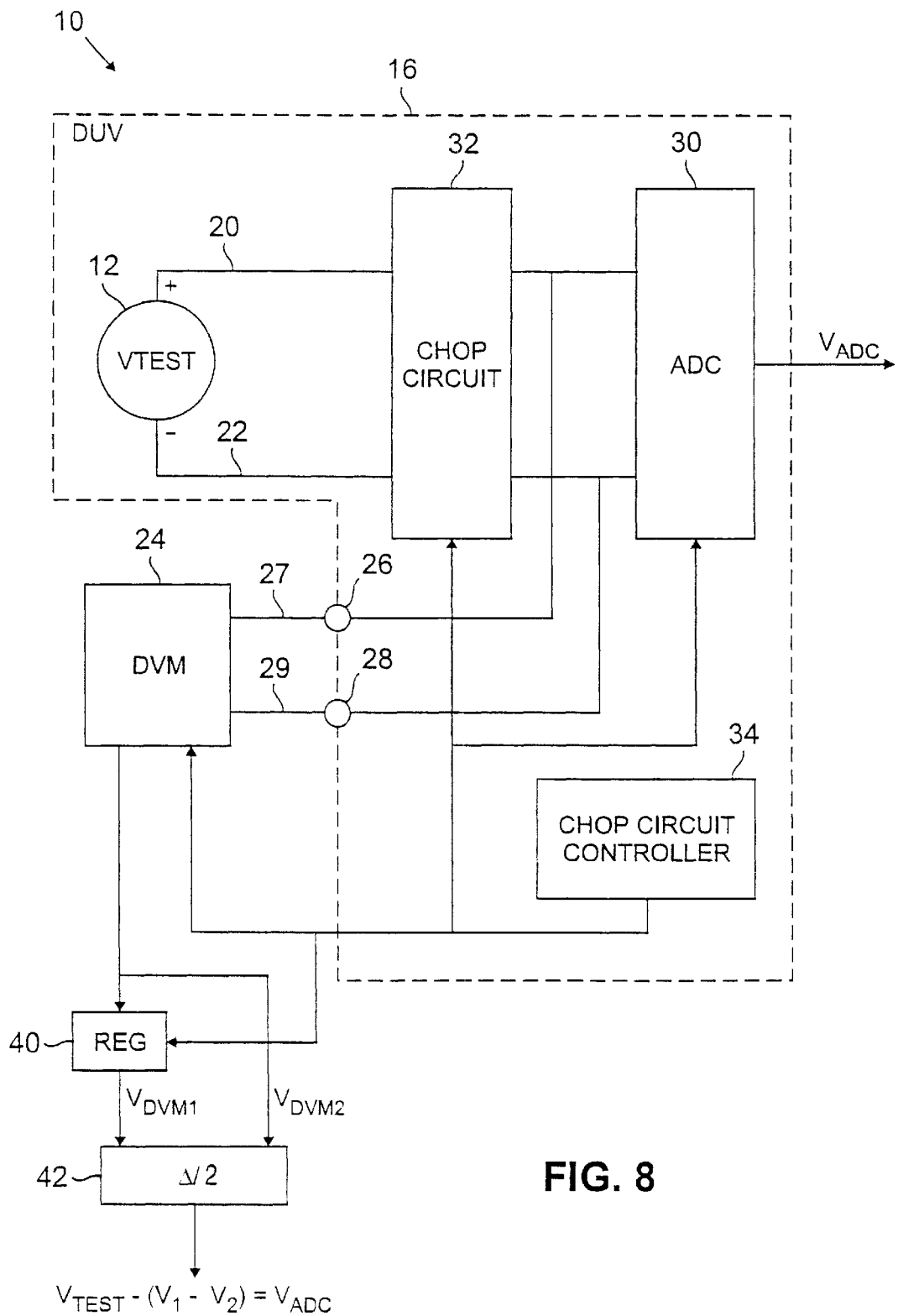
FIG. 8 is a schematic diagram of a test circuit according to another embodiment of the invention.
Figure 8A:
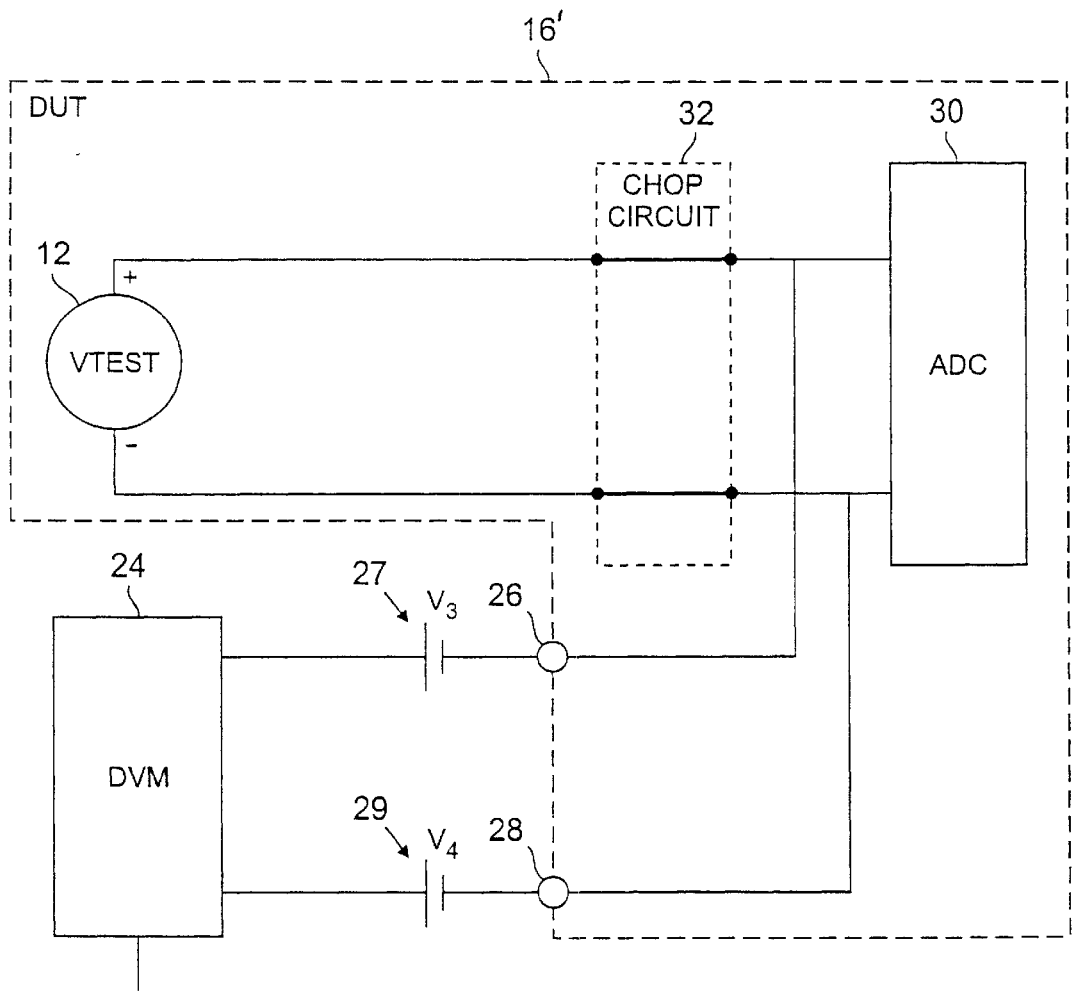
FIG. 8A is a schematic diagram of the test circuit of FIG. 8 when such circuit is configured in response to the control signal produced by such circuit during a first period of time.
Figure 8B:
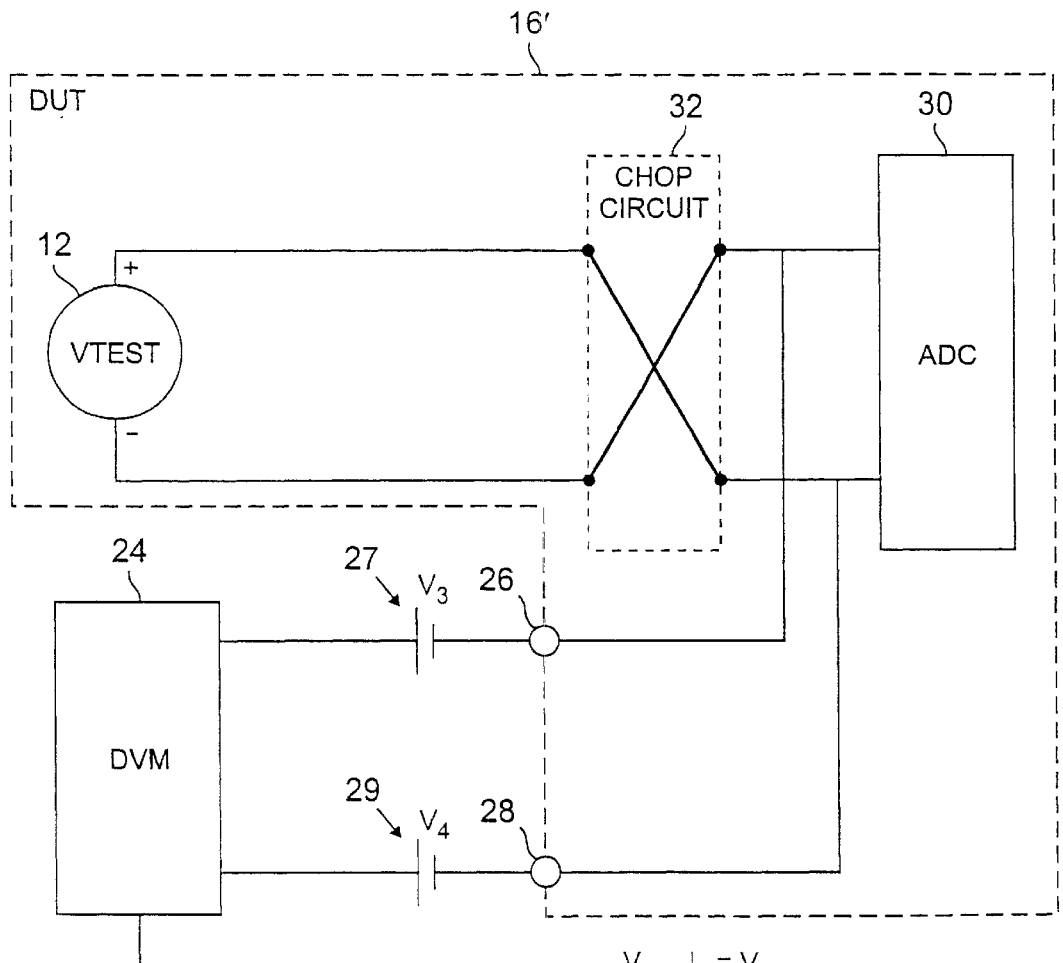
FIG. 8B is a schematic diagram of the test circuit of FIG. 8 when such circuit is configured in response to the control signal during a second period of time.

Referring now to FIG. 8, the test signal source described above in connection with the test circuit 10 of FIG. 3 is on the integrated circuit 16, as shown. Thus, when the chop circuit 32 is in one state, as shown in FIG. 8A, the voltage of the DVM 24 is equal to $V_{TEST}-(V_4-V_3)$ and when in the other state, as shown in FIG. 8B, the voltage of the DVM 24 is equal to $-V_{TEST}-(V_4-V_3)$. Thus, the output of the divide by two circuit in FIG. 8 subtracts $-V_{TEST}+(V_4-V_3)$ from $V_{TEST}-(V_4-V_3)$ resulting in an output of $V_{TEST}$ that $V_{TEST}$ has successfully been measured in the presence $V_4$ and $V_3$.

Other embodiments are within the spirit and scope of the appended claims.

What is claimed is:

1. A circuit for testing an integrated circuit, comprising:
   a chop circuit;
   a source of a test signal coupled to a first pair of pins of the integrated circuit;
   a test signal measuring device to measure the test signal coupled to a second pair of pins of the integrated circuit;
   a chop circuit controller for producing a control signal and for feeding such control signal to the chop circuit and the test signal measuring device; and
   wherein in response to the control signal the chop circuit couples the first pair of pins to the second pair of pins with a first polarity during a first period of time and couples the first pair of pins to the second pair of pins with an opposite polarity during a second period of time.

2. The circuit recited in claim 1 wherein the chop circuit is disposed on the integrated circuit.

3. The circuit recited in claim 1, wherein the integrated circuit includes an analog to digital converter and wherein the chop circuit is coupled between the first pair of pins and the analog digital converter.

4. The circuit recited in claim 1, wherein the integrated circuit includes an analog to digital converter and wherein the chop circuit is coupled between the second pair of pins and the analog to digital converter, said test signal measuring device is also coupled to said second pair of pins.

5. A circuit for testing an integrated circuit, comprising:
   a chop circuit;
   a external source of a test signal coupled to a first pair of pins of the integrated circuit that is external to said integrated circuit;
   a test signal measuring device to measure the test signal coupled to a second pair of pins of the integrated circuit;

a chop circuit controller for producing a control signal and for feeding such control signal to the chop circuit and the test signal measuring device; and wherein in response to the control signal the chop circuit couples the first pair of pins to the second pair of pins with a first polarity during a first period of time and couples the first pair to the second pair of pins with an opposite polarity during a second period of time.

6. The circuit recited in claim 5, wherein the chop circuit is disposed on the integrated circuit.

7. The circuit recited in claim 5, wherein the integrated circuit includes an ananlog to digital converter and wherein the chop circuit is coupled between the first pair of pins and the analog digital converter.

8. The circuit recited in claim 5, wherein the integrated circuit includes an analog to digital converter and wherein the chop circuit is coupled between the second pair of pins and the analog to digital converter, said test signal measuring device is also coupled to said second pair of pins.

9. A circuit for testing an integrated circuit, comprising:

a chop circuit;

a source of a test signal coupled to a first pair of pins of the integrated circuit that is either external or internal to said integrated circuit;

a test signal measuring device to measure the test signal coupled to a second pair of pins of the integrated circuit;

a chop circuit controller for producing a control signal and for feeding such control signal to the chop circuit and the test signal measuring device; and wherein in response to the control signal the chop circuit couples the first pair of pins to the second pair of pins with a first polarity during a first period of time and couples the first pair to the second pair of pins with an opposite polarity during a second period of time.

10. The circuit recited in claim 9, wherein the chop circuit is disposed on the integrated circuit.

11. The circuit recited in claim 9, wherein the integrated circuit includes an analog to digital converter and wherein the chop circuit is coupled between the first pair of pins and the analog digital converter.

12. The circuit recited in claim 9, wherein the integrated circuit includes an analog to digital converter and wherein the chop circuit is coupled between the second pair of pins and the analog to digital converter, said test signal measuring device is also coupled to said second pair of pins.

* * * * *